United States Patent
Loeckenhoff et al.

(10) Patent No.: US 9,496,423 B2
(45) Date of Patent: Nov. 15, 2016

(54) LIGHT CONVERTER

(75) Inventors: Ruediger Loeckenhoff, Bietigheim-Bissingen (DE); Klaus-Dieter Rasch, Nordheim (DE)

(73) Assignee: Azur Space Solar Power GmbH, Heilbronn (DE)

( * ) Notice: Subject to any disclaimer, the term of this patent is extended or adjusted under 35 U.S.C. 154(b) by 132 days.

(21) Appl. No.: 14/143,741

(22) PCT Filed: Aug. 18, 2012

(86) PCT No.: PCT/EP2012/002565
§ 371 (c)(1),
(2), (4) Date: Dec. 30, 2013

(87) PCT Pub. No.: WO2013/000545
PCT Pub. Date: Jan. 3, 2013

(65) Prior Publication Data
US 2015/0107648 A1    Apr. 23, 2015

(30) Foreign Application Priority Data
Jun. 30, 2011 (EP) .................................... 11005332

(51) Int. Cl.
*H01L 31/042* (2014.01)
*H01L 31/02* (2006.01)
(Continued)

(52) U.S. Cl.
CPC ........... *H01L 31/0201* (2013.01); *H01L 31/05* (2013.01); *H01L 31/054* (2014.12); *Y02E 10/52* (2013.01)

(58) Field of Classification Search
CPC ...................................... H01L 31/05–31/0508
USPC ................................................... 136/243–265
See application file for complete search history.

(56) References Cited

U.S. PATENT DOCUMENTS 3,973,996 A * 8/1976 Kennedy ........................ 136/206
4,617,420 A    10/1986 Dilts et al.
6,265,653 B1 * 7/2001 Haigh et al. .................. 136/249
(Continued)

FOREIGN PATENT DOCUMENTS

CN    201210493 Y    3/2009
CN    101523617 A    9/2009
(Continued)

OTHER PUBLICATIONS

Chinese Office Action for Chinese Application No. 20128003521. 4—English translation.

*Primary Examiner* — Jeffrey T Barton
*Assistant Examiner* — Niki Bakhtiari
(74) *Attorney, Agent, or Firm* — Muncy, Geissler, Olds & Lowe, P.C.

(57) ABSTRACT

A light converter for the photovoltaic conversion of light, having a support, a first semiconductor body, and a second semiconductor body. A first surface and a second surface are designed as receiving surfaces for light. An electrically conductive connector having a first arm and a second arm is provided, and the first arm is arranged on the first surface and interconnected with the first surface, and the second arm is arranged below the second rear surface and interconnected with the second rear surface. The second arm is at least partially embedded in a conductive material, the conductive material being arranged between the second rear surface and a second conductive track, and the second conductive track is formed as part of the support.

20 Claims, 2 Drawing Sheets

(51) Int. Cl.
*H01L 31/05* (2014.01)
*H01L 31/054* (2014.01)

(56) References Cited

U.S. PATENT DOCUMENTS

| | | | | |
|---|---|---|---|---|
| 6,399,874 B1 * | 6/2002 | Olah | ............ | F24J 2/085 |
| | | | | 136/246 |
| 6,531,653 B1 * | 3/2003 | Glenn et al. | ............ | 136/246 |
| 6,532,653 B1 | 3/2003 | Alpert | | |
| 2004/0069340 A1 * | 4/2004 | Luch | ............ | 136/243 |
| 2005/0072457 A1 * | 4/2005 | Glenn | ............ | 136/246 |
| 2009/0032087 A1 * | 2/2009 | Kalejs | ............ | 136/246 |
| 2010/0084001 A1 * | 4/2010 | Tsunomura | ......... | H01L 31/0747 |
| | | | | 136/244 |
| 2010/0263706 A1 * | 10/2010 | Isono et al. | ............ | 136/244 |
| 2010/0275976 A1 | 11/2010 | Rubin et al. | | |
| 2011/0132451 A1 | 6/2011 | Von Campe et al. | | |

FOREIGN PATENT DOCUMENTS

| | | |
|---|---|---|
| DE | 1 927 387 A1 | 12/1970 |
| DE | 10 2008 046 329 A1 | 3/2010 |
| EP | 2 068 372 A1 | 6/2009 |
| EP | 2 086 023 A1 | 8/2009 |
| WO | WO 2009/069415 A1 | 6/2009 |

\* cited by examiner

LIGHT CONVERTER

This nonprovisional application is a continuation of International Application No. PCT/EP2012/002565, which was filed on Jun. 18, 2012, and which claims priority to European Patent Application No. 11005332.9, which was filed in Germany on Jun. 30, 2011, and which are both herein incorporated by reference.

BACKGROUND OF THE INVENTION

1. Field of the Invention

The invention relates to a light converter.

2. Description of the Background Art

U.S. Pat. No. 6,532,653 B1 discloses a light converter in which a plurality of solar cells arranged in rows are connected in series. Within a row, the individual solar cells are arranged in parallel on conductive layers and are electrically connected to the layers. In order to form a series connection from a row to an immediately adjacent row, a U-shaped connector encloses both the surface of a solar cell and the rear face of the same solar cell. An insulating layer is formed on the rear face inside the connector in order to avoid a short circuit between the front side and rear side of the applicable semiconductor body. In order to insulate the individual conductive layers from one another, silicone fittings are implemented on the rear side of the individual solar cell between the U-shaped connector and the rest of the rear side.

In addition, various photovoltaic modules are known from U.S. 20100275976, DE 10 2008 046329 A1, U.S. 20110132451, and DE 19 27 387 A1. In particular, U.S. 20100275976 A1 discloses mechanical connectors that are coated on one side with an electrically insulating, preferably optically transparent, film. An adhesive layer is applied to the film, wherein wires having a low-melting alloy project from the adhesive layer in order to electrically connect the surface or the rear side of the solar cell to the wires. In order to achieve a series connection of individual solar cells, the wires of the first connector, with which electrical contact is made to the surface, are electrically connected by means of a bus bar to the wires of the second connector, with which electrical contact is made to the rear side. The bus bar is implemented on the rear side of the solar cells between the first connector and the second connector.

SUMMARY OF THE INVENTION

It is therefore an object of the present invention to provide a device that advances the state of the art.

According to an embodiment of the invention, a light converter designed for the photovoltaic conversion of light is provided that has a support with a front face and rear face, and a first semiconductor body with a first surface and a first rear face, wherein the first rear face is arranged on the front face of the support, and a second semiconductor body with a second surface and a second rear face, wherein the second rear face is arranged on the front face of the support, and the first surface of the first semiconductor body is connected to the second rear face of the second semiconductor body, and the first surface and the second surface are implemented as receiving surfaces for light, wherein an electrically conductive connector having a first arm and a second arm is provided, and the first arm is located on the first surface and is connected to the first surface, and the second arm is located under the second rear face and is connected to the second rear face by the means that the second arm is at least partially embedded in a conductive material and the conductive material is located between the second rear face and a second conductive track, and the second conductive track is implemented as part of the support. It should be noted that the plate-like support is preferably implemented as a PC board, in particular as a ceramic printed circuit board with thick-film conductors. The conductive track can be implemented as a coating on the printed circuit board, among other ways. A different variant is to manufacture the printed circuit board using the "Direct Copper Bonding" (DCB) method. It should further be noted that both the first arm and the second arm are electrically connected to the applicable face, and the conductive material forms a material-to-material connection with the second rear face and the connector and the second conductive track. In this way, the volume between the rear face of the semiconductor body and the conductive track is largely filled with the conductive material, which preferably is implemented as solder pads. The semiconductor body is thus soldered onto the conductor, which is to say onto the front face of the support, wherein the second conductive track is implemented as part as the support. Overall, even a single connector produces an electrical connection between the surface and the rear face of two adjacent semiconductor bodies. It is a matter of course that the two semiconductor bodies are located in adjacent rows.

It is an advantage that mass production of light converters with a plurality of semiconductor bodies connected in series can be realized in a very simple and economical manner by means of the device according to the invention. Preferably the semiconductor bodies are implemented as solar cells in this context. Specifically, the manner of connection using an arm-type connector is suitable for economical and reliable mass production of solar cell modules having solar cells from the III-V group in particular. Specifically, tests by the applicant have shown that, surprisingly, a simple, sequential mounting of the semiconductor bodies in a row can be achieved with the novel connection technique. In this technique, a first arm of a first connector is initially connected to a first semiconductor body, and a first arm of the second connector is connected to a second semiconductor body. The semiconductor bodies are then arranged such that the second semiconductor body overlaps a second arm of the first connector. The electrical connection is accomplished by the conductive material. According to a preferred embodiment, the connector is implemented as a bond wire, in particular as a strip-type bond wire. In this design, it is advantageous to attach multiple bond wires to the surface of the semiconductor body depending on its size.

In contrast to the prior art from U.S. Pat. No. 6,532,653 B1, the resource-intensive manufacture of semiconductor bodies with two mutually insulated, overlapping metallic rear-side contacts, each on the respective rear face of a semiconductor body, is eliminated. Furthermore, the U-shaped connector must be routed closely around the solar cell edge, and must be welded on the front side as well as on the rear side. With the welding on the rear side, the danger exists that the insulating layer between the overlapping metal layers will be damaged. Furthermore, the resource-intensive placement of the U-shaped connector is eliminated.

It should be noted that the connector should be implemented in a low-resistance manner, preferably from a metal, most preferably from silver or a silver compound in order to conduct currents of up to 25 amperes per semiconductor body with low power dissipation.

In a further embodiment, the conductive material wets essentially the full area of the second rear face of the second semiconductor body and in so doing forms a material-to-material connection between the second semiconductor body and the conductive material, and also forms a material-to-material connection between the conductive material and the second conductive track. In this way, an especially low-resistance connection between the semiconductor body and the second conductive track is achieved. In particular, it is preferred for the second conductive material to comprise a solder or a conductive polymer.

In another embodiment, an intermediate piece is located between the first arm and the second arm. The connector has an essentially Z-shaped or step-shaped design in cross-section. It is preferred for the normal vector at the surface of the first arm to be oriented essentially parallel to the normal vector of the second arm, so that the height difference between the two arms is determined essentially by the length of the intermediate piece and its angle of bending relative to the first and the second arms.

In an embodiment, the connector has a wide second arm and multiple first arms in a comb-like arrangement. Each of the multiple first arms independently takes on the function of a current collector for the currents that can be drawn from the first surface. In this way, it is possible to attach the first surface of the first semiconductor body at multiple places, preferably three places, in a low-resistance manner by means of a single connector and to connect it to the second rear face in a low-resistance manner. Alternatively, the first surface can also be connected to the second rear face by multiple, preferably strip-type, connectors. In this context, the width of the intermediate piece preferably corresponds essentially to the width of the first arm and of the second arm.

According to an embodiment, the connector is designed as a single piece, wherein the second arm is at least partially embedded in a solder pad. It is additionally preferred for the first arm or the multiple first arms to be welded to the first surface, while the second arm preferably is soldered to the second rear face.

According to another embodiment, the surface of the support has a first conductive track in the region of the first rear face in addition to the second conductive track, wherein the first conductive track and the second conductive track are spaced apart from one another and are implemented in electrically insulated form. By means of the rail-type design, a plurality of semiconductor bodies or solar cells can be arranged in a row on each of the rails and electrically connected in parallel. In addition, it is advantageous to place diodes for protecting the semiconductor bodies, in particular from overvoltages, and/or electronic components on the rails. Because the semiconductor bodies are electrically connected to the second rail by means of the connectors, a modular type design can easily be produced by arranging multiple rails end to end, producing a high voltage when light is incident on the surface of the semiconductor bodies.

In another embodiment, the conductive material or the solder pad is also implemented on the first conductive track in addition to the second conductive track. In this context, it is preferred for the first rear face and the second rear face to be connected in a material-to-material manner, preferably over the full area, to the relevant solder pad.

In addition, in an embodiment, it is preferred to implement the lateral extent of the relevant solder pad to be slightly smaller than the lateral extent of the rear face of the relevant semiconductor body, which is to say that a narrow edge region is not wetted with solder, thereby reducing the number of short circuits between the surface and the rear face of the relevant semiconductor body. In another embodiment, the first rear face and the second rear face are designed in an edge region such that the relevant edge region is not wetted with solder. In this context, the relevant edge region can be treated mechanically and/or chemically, and/or can be provided with a solder resist, in order to prevent wetting with solder.

In particular it is preferred for the first semiconductor body to have a rectangular design and for the side faces of the semiconductor body to be provided with a solder resist that suppresses the wetting of the edges with solder. In this way, it is possible to prevent short circuits between the edge surfaces of the semiconductor bodies and the connectors, as well as between the edge surfaces of different semiconductor bodies.

Additionally it is preferred for the connector to be coated on at least one side over part of its area, preferably at least on the underside, with a solder resist. In this way, wetting on the underside with the conductive material is suppressed and short circuits between adjacent surfaces of semiconductor bodies are avoided. The solder resists preferably include a polymer, are electrically insulating, and have a temperature stability of several hundreds of degrees Celsius. It should be noted that in an alternative embodiment, different types of solder resist are used in each case for the edge surfaces, the connectors, and the undersides. In particular, provision is made that at least one type of solder resist comprises a metal oxide, preferably also a layer system of a metal layer with a superficial metal oxide layer.

Because the first semiconductor body and the second semiconductor body are connected in series, the voltages produced photovoltaically when light is incident on the receiving surfaces of the first semiconductor body and the second semiconductor body are added. Experiments by the applicant have shown that the semiconductor bodies connected in series to form an array can preferably be used to generate electricity in a concentrator arrangement. In this context, the light converter is arranged with the receiving surfaces at the focal surface of optics that concentrate sunlight. Provision is made in particular for the receiving surfaces to be arranged above a mirror array in the direction of the incident sunlight at the focal surface of the concentrator arrangement, and for the light converter to be rigidly coupled mechanically to the mirror array so that the mirror array is carried along during tracking of the mirror array.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
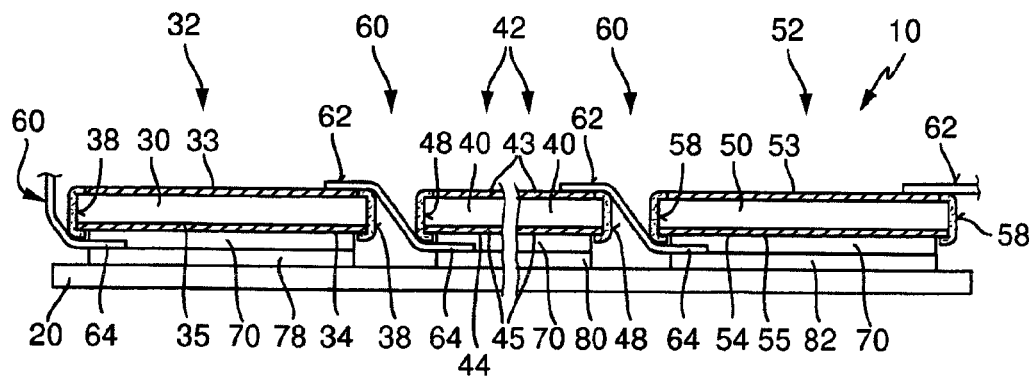
FIG. 1 shows a schematic cross-sectional view of an embodiment according to the invention of a light converter.

The illustration in FIG. 1 shows a schematic cross-sectional view of a light converter 10 with a support 20 with a front face and rear face, and having a first semiconductor body 30, a first surface 32 with a first edge face 33 implemented on the first surface 32, a first rear face 34 with a first rear edge face 35 implemented on the first rear face 34, wherein the first rear face 34 is arranged on the front face of the support 20, and a first surrounding side face 38. In addition, a second semiconductor body 40 is provided, having a second surface 42 with an edge face 43 implemented on the second surface 42, and a second rear face 44 with a second rear edge face 45 implemented on the second rear face 44, wherein the second rear face 44 is arranged on the front face of the support 20, and a second surrounding side face 48. Furthermore, a third semiconductor body 50 is provided, having a third surface 52 with a third edge face 53 implemented on the third surface 52, and a third rear face 54 with a third rear edge face 55 implemented on the third rear face, wherein the third rear face 54 is arranged on the front face of the support 20, and a third surrounding side face 58. Implemented to surround the first surfaces 32, second surfaces 42, and third surfaces 52, but not shown, are the first edge faces 33, second edge faces 43, and third edge faces 53. In addition, the first edge faces 35, second edge face 45, and third edge faces 55 are designed to surround the first rear face 34, second rear face 44, and third rear face 54, but are not shown.

In addition, the first surface 32, the second surface 42, and the third surface 52 are implemented as receiving surfaces for light. In particular, the semiconductor bodies 30, 40, and 50 represent solar cells.

The first surface 32 of the first semiconductor body 30 is series-connected to the second rear face 44 of the second semiconductor body 40 by means of an electrically conductive connector 60. In addition, the second surface 42 of the second semiconductor body 40 is likewise series-connected to the third rear face 54 of the third semiconductor body 50 by means of the electrically conductive connector 60. In this way, the voltages generated photovoltaically between the surface and the rear face of the individual semiconductor bodies can be added.

The connector 60 has a first arm 62 and a second arm 64, wherein the first arm 62 is arranged on the first surface 32 and is connected to the first surface 32. The second arm 64 is located under the second rear face 44 and is connected to the second rear face 44 in a low-resistance manner. To this end, the second arm 64 is at least partially embedded in a conductive material 70. Furthermore, an additional connector 60 connects the second surface 42 to the third rear face 54; the second arm 64 of the additional connector 60 is arranged below the third rear face 54 here. In other words, a series connection between each set of two semiconductor bodies is formed by the connector 60. Investigations by the applicant have shown that it is advantageous for formation of a reliable low-resistance connection to weld the first arm to the applicable surface 32, 42, and 52, and in this way to achieve a low-resistance electrical connection to the applicable surface 32, 42, and 52.

The conductive material 70, which preferably is implemented as solder pads, is arranged between the first rear face 34 and a first conductive track 78, between the second rear face 44 and the second conductive track 80, and between the third rear face 54 and the third conductive track 82. The conductive material forms a material-to-material connection with the applicable rear faces 34, 44, and 54, on the one hand, and with the conductive tracks 78, 80, and 82 on the other hand, which are associated with the rear faces. In this context it is preferred to completely wet the rear faces all the way to the narrow edge faces, or in other words up to the edge regions, with the conductive material 70 in order to achieve a connection of the entire rear face of the applicable semiconductor body with the associated conductive track that is thermally conductive over nearly the full area and as low-resistance as possible. In order to suppress wetting with the conductive material 70, the edge faces on the applicable surface and the applicable rear faces, as well as the side faces of the individual semiconductor bodies, are specially shaped or designed. Preferably the edge regions and side faces have electrically insulating masking agent or solder resist, in particular implemented as a polymer. By suppressing wetting for the conductive material, a short circuit during manufacture of modules and soldering between the applicable surface and the rear face of the applicable semiconductor body can be prevented.

The first conductive track 78, the second conductive track 80, and the third conductive track 82 preferably are implemented as part of the support 20 and spaced apart from one another by means of an insulating strip. In this context, the longitudinal axes of the first conductive track 78, second conductive track 80, and third conductive track 82 extend into the plane of the drawing and are designed to accommodate a plurality of semiconductor bodies or solar cells along the longitudinal axes and connect them together in parallel with as little resistance as possible. The tracks are connected to one another in a series connection by means of the connectors 60 and the semiconductor bodies.

Figure 2:
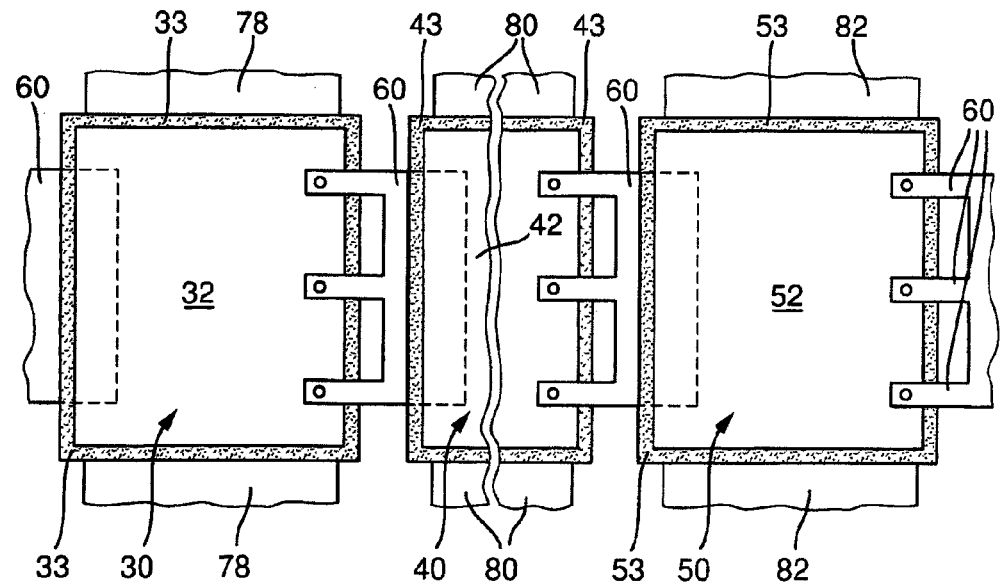
FIG. 2 shows a schematic top view of a first embodiment of a series connection of multiple semiconductor bodies of the light converter from FIG. 1.

FIG. 2 shows a schematic top view of a first embodiment of a series connection of multiple semiconductor bodies of the light converter from FIG. 1. Only the differences from the embodiment shown in FIG. 1 are explained below. Now it is evident that the first edge surfaces 33, the second edge surfaces 43, and the third edge surfaces 53 are implemented surrounding the first surfaces 32, the second surfaces 42, and the third surfaces 52. The relevant surfaces are in each case connected in a low-resistance manner to an adjacent rear face by the connector 60, which has a wide second arm 63 and three first arms 62 in a comb-like arrangement. Each of the three first arms 62 has a weld point at its end, which is to say that it is welded to the surface. To this end, the surfaces have a suitable metal area under the end pieces of the first arms.

Figure 3:
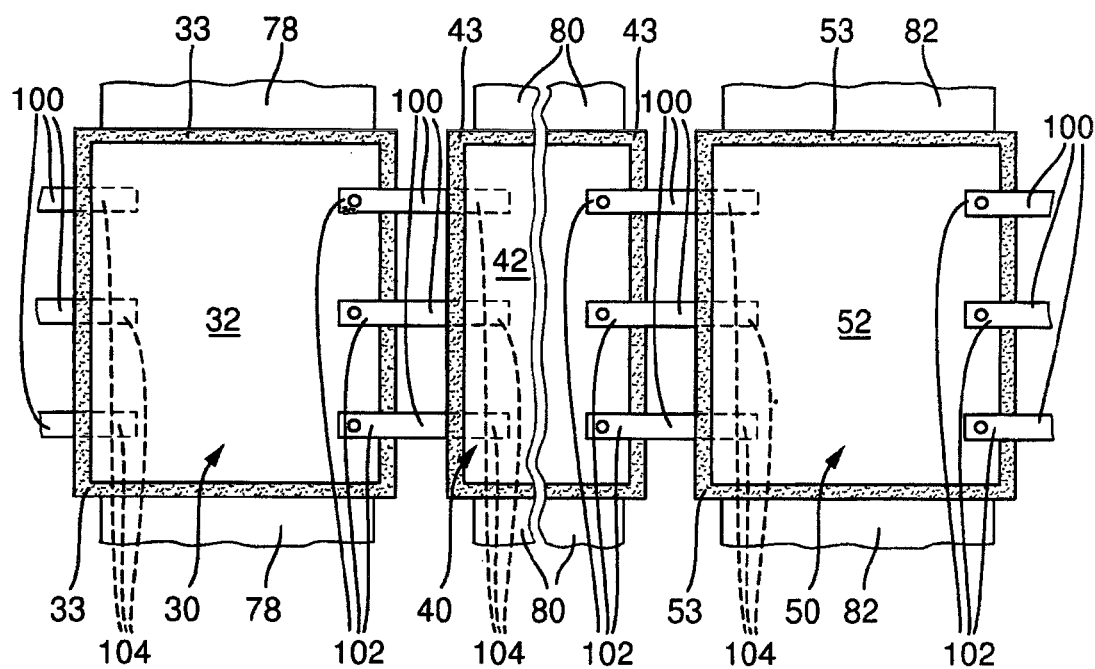
FIG. 3 shows a schematic top view of a second embodiment of a series connection of multiple semiconductor bodies of the light converter from FIG. 1.

FIG. 3 shows a schematic top view of a second embodiment of a series connection of multiple semiconductor bodies of the light converter from FIG. 1. Only the differences from the embodiment shown in FIG. 2 are explained below. In place of the single wide connector 60, the surfaces of each of the semiconductor bodies are connected to the next rear face in a low-resistance manner by three individual connectors 100 that are designed with a strip shape and have a first arm 102 and a second arm 104. Each of the first arms 102 has a weld point for connecting the first arm 102 with the underlying metal area—not shown—located on the relevant surface.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A light converter for photovoltaic conversion of light, the light converter comprising:
   a support with a front face and rear face;
   a first semiconductor body with a first surface and a first rear face, the first rear face being arranged on the front face of the support; and
   a second semiconductor body with a second surface and a second rear face, the second rear face being arranged on the front face of the support,
   wherein the first surface of the first semiconductor body is connected to the second rear face of the second semiconductor body,
   wherein the first surface and the second surface are structured as receiving surfaces for light,
   wherein the support is implemented as a printed circuit board, and an electrically conductive connector having a first arm and a second arm is provided, the first arm being arranged on the first surface and being electrically connected to the first surface, the second arm being arranged under the second rear face and being electrically connected to the second rear face,
   wherein the second arm is at least partially embedded in a conductive material and sandwiched by the conductive material and a second conductive track, the conductive material forming a connection with the second rear face and being arranged between the second rear face and the second conductive track,
   wherein the second conductive track is arranged on the front face of the support, and
   wherein the second arm is at least partially located under the second semiconductor body.

2. The light converter according to claim 1, wherein the conductive material wets essentially the full area of the second rear face and a connection is formed between the second semiconductor body and the conductive material, and wherein a connection is formed between the conductive material and the second conductive track.

3. The light converter according to claim 1, wherein an intermediate piece is arranged between the first arm and the second arm, and wherein the connector has an essentially step-shaped design in cross-section.

4. The light converter according to claim 1, wherein the connector has a plurality of first arms in a comb-like arrangement, and wherein each of the plurality of first arms is implemented as a current collector for the first surface.

5. The light converter according to claim 1, wherein the first arm is welded to the first surface, and wherein the second arm is soldered to the second rear face.

6. The light converter according to claim 1, wherein the conductive material comprises a solder or a polymer.

7. The light converter according to claim 1, wherein the connector is designed as a single piece, and the conductive material is a solder pad.

8. The light converter according to claim 1, wherein the surface of the support has a first conductive track in a region of the first rear face, wherein the surface of the support has the second conductive track in a region of the second rear face, and wherein the first conductive track and the second conductive track are spaced apart from one another.

9. The light converter according to claim 8, wherein the conductive material or the solder pad is implemented on the first conductive track.

10. The light converter according to claim 7, wherein the first rear face and the second rear face are connected to the solder pads.

11. The light converter according to claim 7, wherein the first rear face and the second rear face are connected by only a single solder pad and electrically conductive connectors, and wherein a lateral extent of a relevant solder pad is smaller than the lateral extent of the rear face of the relevant semiconductor body.

12. The light converter according to claim 1, wherein the first rear face and the second rear face each include a center region and an edge region, and the conductive material is applied only in the center region such that the edge region is not wetted with solder.

13. The light converter according to claim 1, wherein the first semiconductor body has a rectangular design, and wherein side faces of the first semiconductor body are provided with a solder resist or an electrical insulator.

14. The light converter according to claim 13, wherein the solder resist is arranged in a surrounding edge section on the first surface, the second surface, the first rear face, and the second rear face.

15. The light converter according to claim 13, wherein the connector is coated on at least one side over part of its area, or at least on an underside, with a solder resist.

16. The light converter according to claim 13, wherein the solder resist comprises a polymer.

17. The light converter according to claim 13, wherein at least one solder resist comprises a metal oxide, or a metal layer with a superficial metal oxide layer.

18. The light converter according to claim 1, wherein the first semiconductor body and the second semiconductor body are connected in series such that voltages produced photovoltaically when light is incident on the receiving surfaces of the first semiconductor body and the second semiconductor body are added.

19. The light converter according to claim 1, wherein the light converter generates electricity in a concentrator arrangement.

20. The light converter according to claim 19, wherein receiving surfaces are arranged at a focal surface of optics that concentrate sunlight.

* * * * *

UNITED STATES PATENT AND TRADEMARK OFFICE
CERTIFICATE OF CORRECTION

| | | |
|---|---|---|
| PATENT NO. | : 9,496,423 B2 | Page 1 of 1 |
| APPLICATION NO. | : 14/143741 | |
| DATED | : November 15, 2016 | |
| INVENTOR(S) | : Loeckenhoff et al. | |

It is certified that error appears in the above-identified patent and that said Letters Patent is hereby corrected as shown below:

On the Title Page

Item (22) reads:
PCT Filed: Aug. 18, 2012

Should read:
(22) PCT Filed: Jun. 18, 2012

Signed and Sealed this
Tenth Day of January, 2017

Michelle K. Lee
*Director of the United States Patent and Trademark Office*